(12) United States Patent
Fuchimukai et al.

(10) Patent No.: US 11,862,931 B2
(45) Date of Patent: Jan. 2, 2024

(54) LASER SYSTEM AND METHOD FOR MANUFACTURING ELECTRONIC DEVICES

(71) Applicant: Gigaphoton Inc., Tochigi (JP)

(72) Inventors: Atsushi Fuchimukai, Oyama (JP); Chen Qu, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/666,656

(22) Filed: Feb. 8, 2022

(65) Prior Publication Data

US 2022/0158411 A1 May 19, 2022

Related U.S. Application Data

(63) Continuation of application No. PCT/JP2019/036171, filed on Sep. 13, 2019.

(51) Int. Cl.
*H01S 5/024* (2006.01)
*H01S 3/00* (2006.01)
(Continued)

(52) U.S. Cl.
CPC .......... *H01S 5/02453* (2013.01); *H01S 5/164* (2013.01); *H01S 5/2201* (2013.01)

(58) Field of Classification Search
CPC .... H01S 5/02453; H01S 5/164; H01S 5/2201; H01S 3/06758; H01S 3/1618;
(Continued)

(56) References Cited

U.S. PATENT DOCUMENTS 6,002,697 A 12/1999 Govorkov et al.
6,614,584 B1 * 9/2003 Govorkov ............. G02F 1/3544
359/328

(Continued)

FOREIGN PATENT DOCUMENTS

JP 2001-051311 A 2/2001
JP 2001-066654 A 3/2001
(Continued)

OTHER PUBLICATIONS

International Search Report issued in PCT/JP2019/036171; dated Dec. 17, 2019.
(Continued)

*Primary Examiner* — Xinning (Tom) Niu
(74) *Attorney, Agent, or Firm* — Studebaker & Brackett PC

(57) ABSTRACT

In a laser system according to an aspect of the present disclosure, the following components are disposed: a first container that accommodates a first heater and a first crystal holder holding a first nonlinear crystal and includes a first light incident window via which laser light is incident and a first light exit window via which the laser light exits; a second container that accommodates a second heater and a second crystal holder holding a second nonlinear crystal and includes a second light incident window via which the laser light is incident and a second light exit window via which the laser light exits; and a stage that holds the first and second containers. A controller controls the stage to move the first nonlinear crystal away from the optical path of the laser light and inserts the second nonlinear crystal into the optical path of the laser light.

19 Claims, 9 Drawing Sheets

(51) Int. Cl.
*H01S 5/16* (2006.01)
*H01S 5/22* (2006.01)

(58) Field of Classification Search
CPC .... H01S 3/1643; H01S 3/2316; H01S 3/2375; H01S 3/2391; H01S 3/0092; G02F 1/3507

See application file for complete search history.

(56) References Cited

U.S. PATENT DOCUMENTS

| | | | |
|---|---|---|---|
| 2003/0227957 A1* | 12/2003 | Pang | B01D 53/8675 |
| | | | 372/59 |
| 2007/0003208 A1 | 1/2007 | Clar et al. | |
| 2007/0177638 A1 | 8/2007 | Seelert et al. | |
| 2011/0122896 A1 | 5/2011 | Mao | |
| 2012/0033291 A1 | 2/2012 | Kneip | |
| 2015/0016479 A1* | 1/2015 | McDonagh | H01S 3/106 |
| | | | 372/22 |
| 2016/0099540 A1 | 4/2016 | Chuang et al. | |
| 2017/0338619 A1* | 11/2017 | Onose | H01S 3/23 |
| 2019/0245321 A1 | 8/2019 | Kakizaki et al. | |
| 2020/0136339 A1* | 4/2020 | Fuchimukai | H01S 3/027 |
| 2021/0286229 A1* | 9/2021 | Maker | G02F 1/3551 |

FOREIGN PATENT DOCUMENTS

| | | |
|---|---|---|
| JP | 2007-094376 A | 4/2007 |
| JP | 2014-032309 A | 2/2014 |
| JP | 2015-155933 A | 8/2015 |
| JP | 2017-535806 A | 11/2017 |
| JP | 6418752 B2 | 11/2018 |
| WO | 2018/105082 A1 | 6/2018 |

OTHER PUBLICATIONS

International Preliminary Report on Patentability and Written Opinion issued in PCT/JP2019/036171; dated Mar. 15, 2022.
An Office Action issued by the Japanese Patent Office dated Aug. 18, 2023, which corresponds to Japanese Patent Application No. 2021-545083 and is related to U.S. Appl. No. 17/666,656.

* cited by examiner

FIG. 6
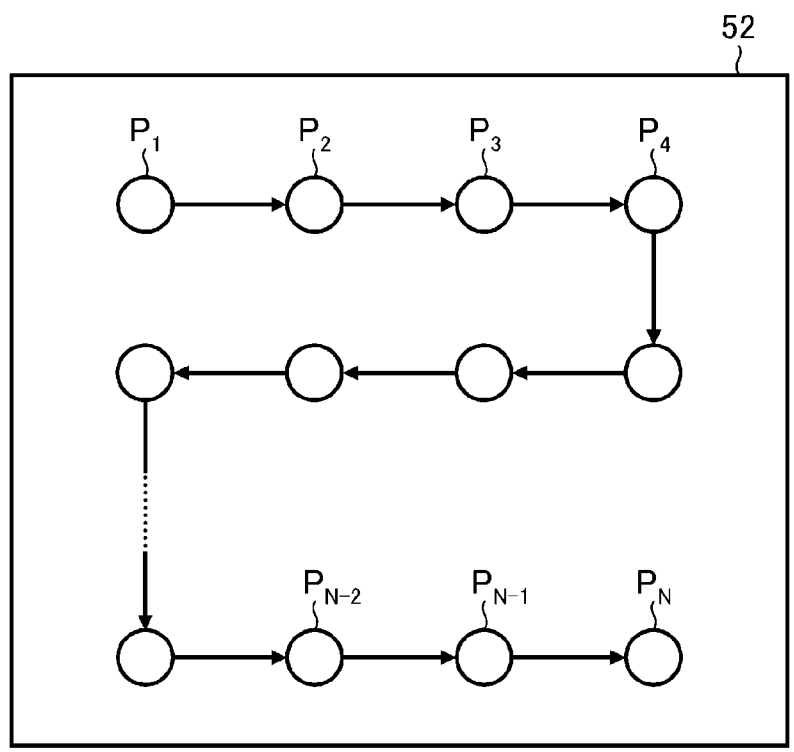
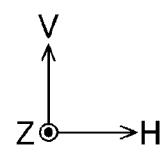

LASER SYSTEM AND METHOD FOR MANUFACTURING ELECTRONIC DEVICES

CROSS-REFERENCE TO RELATED APPLICATIONS

The present application is a continuation application of International Application No. PCT/JP2019/036171, filed on Sep. 13, 2019, the entire contents of which are hereby incorporated by reference.

BACKGROUND

1. Technical Field

The present disclosure relates to a laser system and a method for manufacturing electronic devices.

2. Related Art

A semiconductor exposure apparatus is required to improve the resolution thereof as semiconductor integrated circuits are increasingly miniaturized and highly integrated. The semiconductor exposure apparatus is hereinafter referred simply to as an "exposure apparatus". To improve the resolution, reduction in the wavelength of light outputted from a light source for exposure is underway. A gas laser apparatus is used as the light source for exposure in place of a mercury lamp in related art. At present, a KrF excimer laser apparatus, which outputs ultraviolet light having a wavelength of 248 nm, and an ArF excimer laser apparatus, which outputs ultraviolet light having a wavelength of 193 nm, are used as the gas laser apparatus for exposure.

As a current exposure technology, liquid-immersion exposure, in which the gap between a projection lens of the exposure apparatus and a wafer is filled with a liquid, has been put into use. In the liquid-immersion exposure, since the refractive index of the gap between the projection lens and the wafer changes, the apparent wavelength of the light from the light source for exposure shortens. In the liquid-immersion exposure with an ArF excimer laser apparatus as the light source for exposure, the wafer is irradiated with ultraviolet light having an in-liquid wavelength of 134 nm. The technology described above is called ArF liquid-immersion exposure. The ArF liquid-immersion exposure is also called ArF liquid-immersion lithography.

Since KrF and ArF excimer laser apparatuses each provide a wide spectral linewidth ranging from about 350 to 400 pm in spontaneous oscillation, the chromatic aberrations occur in association with the laser light (ultraviolet light) projected with the size thereof reduced onto the wafer via the projection lens of the exposure apparatus, resulting in a decrease in the resolution. To avoid the decrease in the resolution, the spectral linewidth of the laser light outputted from the gas laser apparatus needs to be narrow enough to make the chromatic aberrations negligible. The spectral linewidth is also called a spectral width. To achieve a narrow spectral linewidth, a line narrowing module including a line narrowing element is provided in a laser resonator of the gas laser apparatus, and the line narrowing module narrows the spectral width. The line narrowing element may, for example, be an etalon or a grating. A laser apparatus providing a narrowed spectral width described above is called a narrowed-line laser apparatus.

CITATION LIST

Patent Literature

[PTL 1] Japanese Patent No. 6,418,752

SUMMARY

A laser system according to an aspect of the present disclosure includes a solid-state laser apparatus configured to output laser light, a first crystal holder configured to hold a first nonlinear crystal placed in an optical path of the laser light, a first heater configured to heat the first nonlinear crystal, a first container configured to accommodate the first heater and the first crystal holder and including a first light incident window via which the laser light is incident and a first light exit window via which the laser light exits, a first gas introduction tube via which a first gas is introduced into the first container, a first gas discharge tube via which the first gas in the first container is discharged, a second crystal holder configured to hold a second nonlinear crystal placed outside the optical path of the laser light, a second heater configured to heat the second nonlinear crystal, a second container configured to accommodate the second heater and the second crystal holder and including a second light incident window via which the laser light is incident and a second light exit window via which the laser light exits when the second container is placed in the optical path of the laser light, a second gas introduction tube via which the first gas is introduced into the second container, a second gas discharge tube via which the first gas in the second container is discharged, a stage configured to hold the first and second containers, and a controller configured to control the stage to move the first nonlinear crystal away from the optical path of the laser light and insert the second nonlinear crystal into the optical path of the laser light.

A method for manufacturing electronic devices according to another aspect of the present disclosure includes causing a laser system to generate excimer laser light, the laser system including a solid-state laser apparatus configured to output laser light, a first crystal holder configured to hold a first nonlinear crystal placed in an optical path of the laser light, a first heater configured to heat the first nonlinear crystal, a first container configured to accommodate the first heater and the first crystal holder and including a first light incident window via which the laser light is incident and a first light exit window via which the laser light exits, a first gas introduction tube via which a first gas is introduced into the first container, a first gas discharge tube via which the first gas in the first container is discharged, a second crystal holder configured to hold a second nonlinear crystal placed outside the optical path of the laser light, a second heater configured to heat the second nonlinear crystal, a second container configured to accommodate the second heater and the second crystal holder and including a second light incident window via which the laser light is incident and a second light exit window via which the laser light exits when the second container is placed in the optical path of the laser light, a second gas introduction tube via which the first gas is introduced into the second container, a second gas discharge tube via which the first gas in the second container is discharged, a stage configured to hold the first and second containers, a controller configured to control the stage to move the first nonlinear crystal away from the optical path of the laser light and insert the second nonlinear crystal into the optical path of the laser light, and an excimer amplifier configured to amplify the laser light that exits via the first or second light exit window; outputting the excimer laser light to an exposure apparatus; and exposing a light sensitive substrate to the excimer laser light in the exposure apparatus to manufacture the electronic devices.

BRIEF DESCRIPTION OF THE DRAWINGS

Embodiments of the present disclosure will be described below only by way of example with reference to the accompanying drawings.

FIG. 6 shows a laser light incident surface of a second CLBO crystal.

DETAILED DESCRIPTION

Contents

Figure 1:
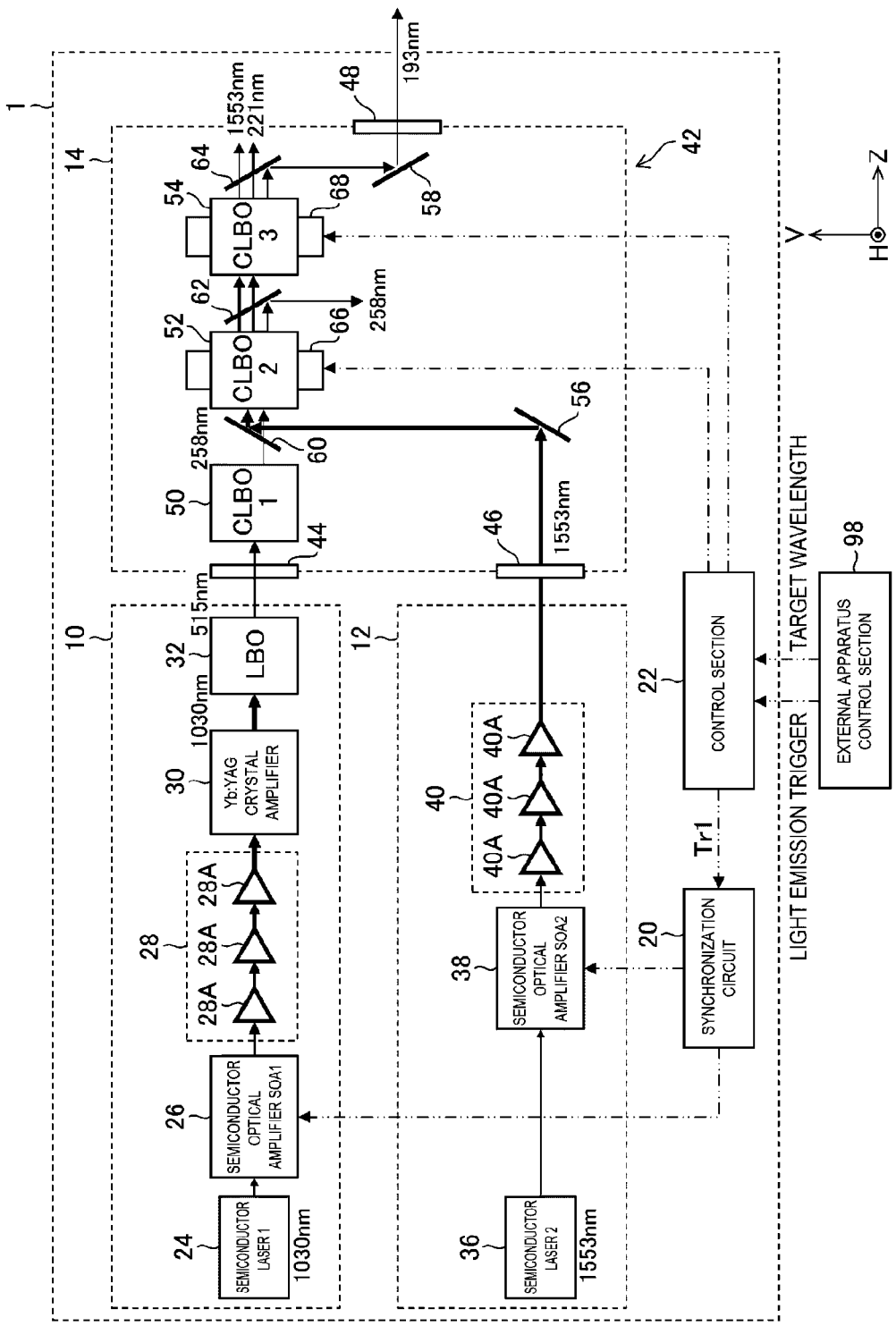
FIG. 1 schematically shows an example of the configuration of a laser system.

1. Description of terms
2. Overview of laser system
2.1 Configuration
2.1.1 Configuration of laser system
2.1.2 Configuration of wavelength conversion system
2.2 Operation
3 Problems
4. First Embodiment
4.1 Configuration
4.2 Operation
4.2.1 Crystal replacement control
4.2.2 Determination of spare cell preparation start timing
4.3 Effects and advantages
5. Second Embodiment
5.1 Configuration
5.2 Operation
5.3 Effects and advantages
6. Method for manufacturing electronic device
7. Others Embodiments of the present disclosure will be described below in detail with reference to the drawings. The embodiments described below show some examples of the present disclosure and are not intended to limit the contents of the present disclosure. Furthermore, all configurations and operations described in the embodiments are not necessarily essential as configurations and operations in the present disclosure. The same component has the same reference character, and no redundant description of the same component will be made.

1. Description of Terms

The terms used in the present specification are defined as follows.

The term "hybrid laser apparatus" refers to a two-stage laser apparatus including an oscillation stage (master oscillator) and an amplification stage (amplifier) with a solid-state laser apparatus provided in the oscillation stage and an excimer laser apparatus provided in the amplification stage. The term "excimer amplifier" refers to the excimer laser apparatus used in the amplification stage.

The term "perpendicular" or "orthogonal" used herein may conceptually include roughly perpendicular or orthogonal, which can be regarded as equal to substantially perpendicular or orthogonal in a technical sense.

2. Overview of Laser System

2.1 Configuration

2.1.1 Configuration of Laser System

FIG. 1 schematically shows an example of the configuration of a solid-state laser system 1. The solid-state laser system 1 includes a first solid-state laser apparatus 10, which outputs first pulsed laser light, a second solid-state laser apparatus 12, which outputs second pulsed laser light, a wavelength conversion system 14, a synchronization circuit 20, and a control section 22.

In the description, the laser light traveling direction is defined as a "direction Z". One direction perpendicular to the direction Z is defined as a "direction V", and the direction perpendicular to the directions V and Z is defined as a "direction H".

The first solid-state laser apparatus 10 includes a first semiconductor laser 24, a first semiconductor optical amplifier SOA 26, an Yb fiber amplifier system 28, an Yb:YAG (yttrium aluminum garnet) crystal amplifier 30, and an LBO ($LiB_3O_5$) crystal 32.

The first semiconductor laser 24 (denoted as semiconductor laser 1 in FIG. 1) is a single longitudinal mode laser that outputs seed light having a wavelength of about 1030 nm when operating in CW or pulsed oscillation. The first semiconductor laser 24 may, for example, be a distributed feedback (DFB) semiconductor laser.

The first semiconductor optical amplifier SOA 26 (denoted as semiconductor optical amplifier SOA1 in FIG. 1) is a semiconductor device that converts the CW or pulsed seed light into pulsed laser light having a predetermined pulse width when a current control element that is not shown causes a pulsed current to flow in a semiconductor portion of the device.

The Yb fiber amplifier system 28 includes multistage optical fiber amplifiers 28A doped with Yb and a CW pumping semiconductor laser that is not shown but operates in CW oscillation to output pumping light and supplies each of the optical fiber amplifiers 28A with the pumping light.

The Yb:YAG crystal amplifier 30 is a YAG crystal doped with Yb. The LBO crystal 32 is a nonlinear crystal.

On the other hand, the second solid-state laser apparatus 12 includes a second semiconductor laser 36 (denoted as semiconductor laser 2 in FIG. 1), a second semiconductor optical amplifier SOA 38 (denoted as semiconductor optical amplifier SOA2 in FIG. 1), and an Er fiber amplifier system 40.

The second semiconductor laser 36 is a single longitudinal mode laser that outputs seed light having a wavelength of about 1553 nm when operating in CW or pulsed oscillation. The second semiconductor laser 36 may, for example, be a distributed feedback (DFB) semiconductor laser.

The second semiconductor optical amplifier SOA 38 is a semiconductor device that converts the CW or pulsed seed light into pulsed laser light having a predetermined pulse width when a current control element that is not shown causes a pulsed current to flow in a semiconductor portion of the device.

The Er fiber amplifier system 40 includes multistage optical fiber amplifiers 40A doped with Er and Yb and a CW pumping semiconductor laser that is not shown but operates in CW oscillation to output pumping light and supplies each of the optical fiber amplifiers 40A with the pumping light.

The wavelength conversion system 14 includes a wavelength conversion box 42, which is an enclosure, a first window 44, a second window 46, and a third window 48. The wavelength conversion system 14 includes the following components housed in the wavelength conversion box 42: a first CLBO ($CsLiB_6O_{10}$) crystal 50; a second CLBO crystal 52; a third CLBO crystal 54; a first high-reflectance mirror 56; a second high-reflectance mirror 58; a first dichroic mirror 60; a second dichroic mirror 62; a third dichroic mirror 64; a first HVθ stage 66; and a second HVθ stage 68.

The wavelength conversion box 42 is an example of the "third container" in the present disclosure. The first window 44 and the second window 46 are disposed on the light incident side of the wavelength conversion box 42. The third window 48 is disposed on the light exit side of the wavelength conversion box 42.

The first window 44, the first CLBO crystal 50, the first dichroic mirror 60, the second CLBO crystal 52, the second dichroic mirror 62, the third CLBO crystal 54, and the third dichroic mirror 64 are arranged in this order along the optical path of the pulsed laser light.

The first high-reflectance mirror 56 is so disposed as to reflect at high reflectance the second pulsed laser light outputted from the second solid-state laser apparatus 12 and incident via the second window 46 and to cause the reflected light to be incident on the first dichroic mirror 60.

The first CLBO crystal 50 (denoted as CLBO1 in FIG. 1) is a nonlinear crystal that generates the first pulsed laser light having a wavelength of about 258 nm from pulsed laser light outputted from the first solid-state laser apparatus 10, incident via the first window 44, and having a wavelength of about 515 nm. The first CLBO crystal 50 is an example of the "first nonlinear crystal" in the present disclosure.

The first dichroic mirror 60 is coated with a film that transmits at high transmittance the first pulsed laser light having the wavelength of about 258 nm and reflects at high reflectance the second pulsed laser light having a wavelength of about 1553 nm. The first dichroic mirror 60 is so disposed that the first pulsed laser light and the second pulsed laser light are incident on the second CLBO crystal 52 in the state in which the optical path axes of the first pulsed laser light and the second pulsed laser light coincide with each other.

The second CLBO crystal 52 (denoted as CLBO2 in FIG. 1) is a nonlinear crystal that uses the first pulsed laser light and the second pulsed laser light incident thereon to generate pulsed laser light having a wavelength of about 221 nm, which corresponds to the sum frequency.

The second dichroic mirror 62 is coated with a film that reflects at high reflectance the first pulsed laser light having the wavelength of about 258 nm and transmits at high transmittance the second pulsed laser light having the wavelength of about 1553 nm and the pulsed laser light generated by the second CLBO crystal 52 and having the wavelength of about 221 nm.

The third CLBO crystal 54 (denoted as CLBO3 in FIG. 1) is a nonlinear crystal that uses the second pulsed laser light having the wavelength of about 1553 nm and the pulsed laser light having the wavelength of about 221 nm incident thereon to generate pulsed laser light having a wavelength of about 193 nm, which corresponds to the sum frequency.

The third dichroic mirror 64 is coated with a film that transmits at high transmittance the second pulsed laser light having the wavelength of about 1553 nm and the pulsed laser light having the wavelength of about 221 nm and reflects at high reflectance the pulsed laser light having the wavelength of about 193 nm.

The second high-reflectance mirror 58 is so disposed as to cause the pulsed laser light having the wavelength of about 193 nm to be outputted from the wavelength conversion system 14 via the third window 48.

The second CLBO crystal 52 and the third CLBO crystal 54 are disposed at the first HVθ stage 66 and the second HVθ stage 68, respectively, each via a first crystal holder 90. The first HVθ stage 66 and the second HVθ stage 68 move in H-axis and V-axis directions, respectively, and rotate around the axis H.

Signal lines are connected to the synchronization circuit 20 and allow it to control the first semiconductor optical amplifier SOA 26 and the second semiconductor optical amplifier SOA 38.

The control section 22 includes a CPU (central processing unit), a ROM (read only memory), a RAM (random access memory), an input/output interface, and other components, none of which is shown. Signal lines are connected to the control section 22 and allow it to control the synchronization circuit 20, the first HVθ stage 66, and the second HVθ stage 68. The control section 22 is communicatively connected to an external apparatus control section 98 external to the solid-state laser system 1. The control section 22 is an example of the "controller" in the present disclosure.

2.1.2 Configuration of Wavelength Conversion System

Figure 2:
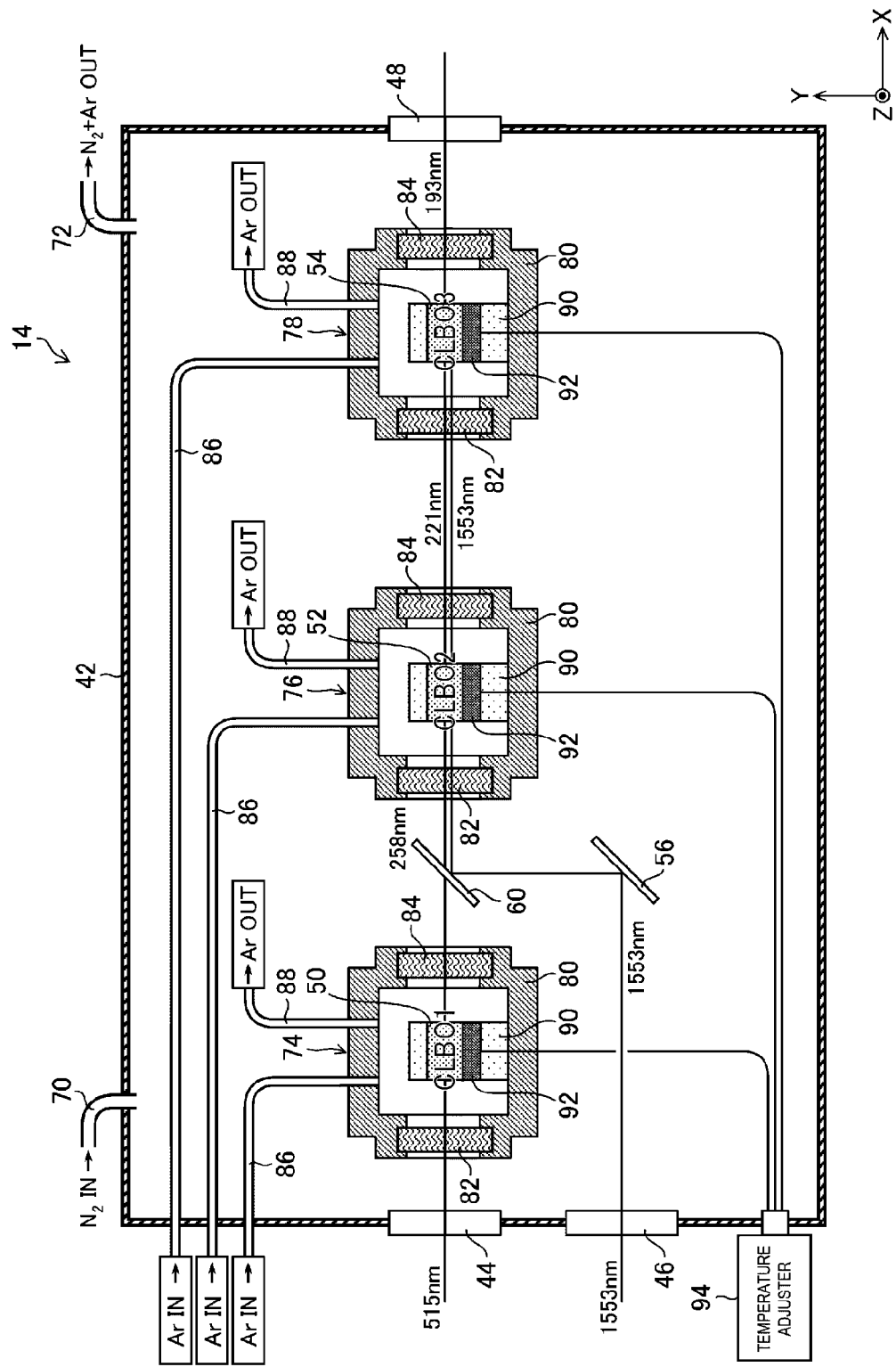
FIG. 2 is a configuration diagram showing an example of a wavelength conversion system.

FIG. 2 is a configuration diagram showing an example of the wavelength conversion system 14. In FIG. 2, the directions in the description are defined as follows: a direction X is the rightward direction; a direction Y is the upward direction orthogonal to the direction X; and a direction Z is the direction orthogonal to the directions X and Y. The wavelength conversion box 42 of the wavelength conversion system 14 includes a first purge gas inlet tube 70 and a first purge gas outlet tube 72, in addition to the first window 44, the second window 46, and the third window 48 described above.

The first purge gas inlet tube 70 and the first purge gas outlet tube 72 cause the spaces inside and outside the wavelength conversion box 42 to communicate with each other. The first purge gas inlet tube 70 is connected to a cylinder that is not shown but supplies, for example, an $N_2$ gas as a purge gas. The first purge gas inlet tube 70 is an example of the "third gas introduction tube" in the present disclosure. The first purge gas outlet tube 72 is an example of the "third gas discharge tube" in the present disclosure. The $N_2$ gas is an example of the "second gas" in the present disclosure.

The wavelength conversion box 42 houses a first CLBO crystal cell 74, a second CLBO crystal cell 76, and a third CLBO crystal cell 78, in addition to the first high-reflectance mirror 56 and the first dichroic mirror 60 described above. The second high-reflectance mirror 58, the second dichroic mirror 62, the third dichroic mirror 64, the first HVθ stage 66, and the second HVθ stage 68 are omitted in FIG. 2.

The first CLBO crystal cell 74, the second CLBO crystal cell 76, and the third CLBO crystal cell 78 include the first CLBO crystal 50, the second CLBO crystal 52, and the third CLBO crystal 54 described above, respectively.

The first CLBO crystal cell 74 includes a first container 80, a second purge gas inlet tube 86, a second purge gas outlet tube 88, the first crystal holder 90, and a first heater 92.

The second purge gas inlet tube 86 causes the space outside the wavelength conversion box 42 to communicate with the space inside the first container 80. The second purge gas inlet tube 86 is connected to a cylinder that is not shown but supplies the first CLBO crystal 50, for example, with an Ar gas or a He gas, which are inert gases. In the example shown in FIG. 2, the second purge gas inlet tube 86 is connected to a cylinder containing an Ar gas as the purge gas. The second purge gas inlet tube 86 is an example of the "first gas introduction tube" in the present disclosure. The Ar gas is an example of the "first gas" in the present disclosure.

The second purge gas outlet tube 88 causes the space inside the first container 80 to communicate with the space inside the wavelength conversion box 42. The second purge gas outlet tube 88 is an example of the "first gas discharge tube" in the present disclosure.

The first container 80 includes a first light incident window 82 and a first light exit window 84. In the first container 80, the first light incident window 82 is disposed on the light incident side of the wavelength conversion box 42, and the first light exit window 84 is disposed on the light exit side thereof.

The first container 80 accommodates the first crystal holder 90 and the first heater 92. The first crystal holder 90 is a holding member that holds the first CLBO crystal 50. The first heater 92 is a heating member that heats the first CLBO crystal 50.

The first CLBO crystal cell 74, the second CLBO crystal cell 76, and the third CLBO crystal cell 78 have the same configuration, and the configurations of the second CLBO crystal cell 76 and the third CLBO crystal cell 78 will therefore not be described.

The wavelength conversion system 14 further includes a temperature adjuster 94 external to the wavelength conversion box 42. The temperature adjuster 94 is provided in the control section 22 (see FIG. 1). The temperature adjuster 94 is connected to the first heaters 92 in the first CLBO crystal cell 74, the second CLBO crystal cell 76, and the third CLBO crystal cell 78.

2.2 Operation

The operation of the solid-state laser system 1 will be described. In the description, the temperature adjuster 94 controls the first heaters 92 in the first CLBO crystal cell 74, the second CLBO crystal cell 76, and the third CLBO crystal cell 78 to heat the first CLBO crystal 50, the second CLBO crystal 52, and the third CLBO crystal 54 to 150° C. in advance. The spaces inside the first CLBO crystal cell 74, the second CLBO crystal cell 76, and the third CLBO crystal cell 78 are each purged with the Ar gas in advance via the second purge gas inlet tube 86 and the second purge gas outlet tube 88.

Furthermore, the space inside the wavelength conversion box 42 is purged with the $N_2$ gas in advance via the first purge gas inlet tube 70 and the first purge gas outlet tube 72.

The control section 22 develops in the RAM, which is not shown, a variety of programs, such as a control program, stored in the ROM, which is not shown, and the CPU, which is not shown, executes the programs developed in the RAM.

When the control section 22 receives a laser oscillation preparation signal and a target oscillation wavelength from the external apparatus control section 98, the control section 22 causes the first semiconductor laser 24, the CW pumping semiconductor laser that is not shown but is provided in the Yb fiber amplifier system 28, the second semiconductor laser 36, and the CW pumping semiconductor laser that is not shown but is provided in the Er fiber amplifier system 40 to undergo CW or pulsed oscillation.

Furthermore, when the control section 22 receives a light emission trigger from the external apparatus control section 98, the control section 22 transmits a trigger signal Tr1 to the synchronization circuit 20.

Having received the trigger signal Tr1 from the control section 22, the synchronization circuit 20 transmits control signals to the first semiconductor optical amplifier SOA 26 and the second semiconductor optical amplifier SOA 38.

In the first solid-state laser apparatus 10, the first semiconductor optical amplifier SOA 26 converts the laser light outputted from the first semiconductor laser 24 and having a wavelength of about 1030 nm into laser light having a predetermined pulse width and amplifies the converted laser light, and the amplified laser light enters the Yb fiber amplifier system 28 as the pulsed seed light.

The Yb fiber amplifier system 28 and the Yb:YAG crystal amplifier 30 amplify the pulsed seed light. The LBO crystal 32 generates pulsed laser light having a wavelength of about 515 nm from the amplified pulsed laser light.

The pulsed laser light outputted from the first solid-state laser apparatus 10 and having the wavelength of about 515 nm enters the first CLBO crystal 50 in the wavelength conversion system 14 via the first window 44.

The first CLBO crystal 50 uses the pulsed laser light having the wavelength of about 515 nm incident thereon to generate the first pulsed laser light having the wavelength of about 258 nm and causes the first pulsed laser light to be incident on the first dichroic mirror 60.

In the second solid-state laser apparatus 12, on the other hand, the second semiconductor optical amplifier SOA 38 converts the CW or pulsed oscillation laser light outputted from the second semiconductor laser 36 and having the wavelength of about 1553 nm into laser light having a predetermined pulse width and amplifies the converted laser light, and the amplified laser light enters the Er fiber amplifier system 40. The Er fiber amplifier system 40 further amplifies the pulsed seed light.

The second pulsed laser light outputted from the second solid-state laser apparatus 12 and having the wavelength of about 1553 nm is incident on the first high-reflectance mirror 56 in the wavelength conversion system 14 via the second window 46. The first high-reflectance mirror 56 reflects at high reflectance the second pulsed laser light incident thereon and causes the reflected pulsed laser light to be incident on the first dichroic mirror 60.

The synchronous circuit 20 transmits a signal having a predetermined pulse width to the first semiconductor optical amplifier SOA 26 and the second semiconductor optical amplifier SOA 38 at predetermined timings based on the trigger signal Tr1. The wavelength conversion system 14 adjusts the predetermined pulse width in such a way that the pulsed laser light having the wavelength of about 193 nm has a desired pulse width. The adjustment of the pulse width allows adjustment of the pulse width of the pulsed laser light having the wavelength of about 193 nm. The predetermined timings are so adjusted that the first pulsed laser light outputted from the first CLBO crystal 50 and the second pulsed laser light outputted from the Er fiber amplifier system 40 enter the second CLBO crystal 52 roughly at the same time.

The first pulsed laser light having the wavelength of about 258 nm and the second pulsed laser light having the wavelength of about 1553 nm therefore enter the second CLBO crystal 52 roughly at the same time, and the two beams overlap with each other on the second CLBO crystal 52. As a result, the second CLBO crystal 52 generates the pulsed laser light having the wavelength of about 221 nm, which corresponds to the sum frequency produced from about 258 nm and about 1553 nm.

The second dichroic mirror 62 reflects at high reflectance the pulsed laser light having the wavelength of about 258 nm. The second dichroic mirror 62 transmits at high transmittance the pulsed laser light having the wavelength of about 1553 nm and the pulsed laser light having the wavelength of about 221 nm incident thereon and causes the transmitted pulsed laser light to enter the third CLBO crystal 54.

The third CLBO crystal 54 uses the pulsed laser light having the wavelength of about 1553 nm and the pulsed laser light having the wavelength of about 221 nm incident thereon to generate the pulsed laser light having the wavelength of about 193 nm, which is the sum frequency produced from about 1553 nm and about 221 nm.

The third dichroic mirror 64 transmits at high transmittance the pulsed laser light having the wavelength of about 1553 nm and the pulsed laser light having the wavelength of about 221 nm. The third dichroic mirror 64 reflects at high reflectance the pulsed laser light having the wavelength of about 193 nm and causes the reflected pulsed laser light to be incident on the second high-reflectance mirror 58. The second high-reflectance mirror 58 reflects at high reflectance the incident pulsed laser light having the wavelength of about 193 nm and outputs the reflected pulsed laser light out of the wavelength conversion system 14 via the third window 48.

The second CLBO crystal 52 and the third CLBO crystal 54 are damaged in some cases by the ultraviolet pulsed laser light having any of the wavelengths of about 258 nm, 221 nm, and 193 nm.

To avoid the damage, the control section 22 controls the first HVθ stage 66 and the second HVθ stage 68 in such a way that the second CLBO crystal 52 and the third CLBO crystal 54 move by a predetermined distance in the direction V or H whenever a predetermined number of shots of the pulsed laser light are applied. As a result, the laser light incident points can be changed, whereby the crystal lifetimes of the second CLBO crystal 52 and the third CLBO crystal 54 can be extended.

When the external device control section 98 changes the target wavelength of the output laser light, the control section 22 changes the oscillation wavelength of the laser light from the first semiconductor laser 24 or the second semiconductor laser 36 and controls the first HVθ stage 66 and the second HVθ stage 68 in such a way that the angle of incidence of the light incident on the second CLBO crystal 52 and the angle of incidence of the light incident on the third CLBO crystal 54 are each the phase-matching angle corresponding to the target wavelength.

3. Problems

Since CLBO crystals are deliquescent and hygroscopic, the first CLBO crystal 50, the second CLBO crystal 52, and the third CLBO crystal 54 are used as being heated to 150° C. with the interiors of the first CLBO crystal cell 74, the second CLBO crystal cell 76, and the third CLBO crystal cell 78 purged with the Ar gas or any other purge gas.

For example, when the first CLBO crystal 50 reaches the end of its life, the temperature thereof is gradually lowered, and the wavelength conversion box 42 and the first CLBO crystal cell 74 are then opened, followed by replacement of the first CLBO crystal 50.

Furthermore, since the first CLBO crystal 50 is heated in the first CLBO crystal cell 74 and used with the temperature maintained, it takes three to four days to heat, increase the temperature of, and dehydrate the first CLBO crystal 50 after the replacement, resulting in a time-consuming maintenance process as a whole.

As described above, it takes a long period to replace the CLBO crystal and generate deep ultraviolet light having the wavelength of about 193 nm.

4. First Embodiment

4.1 Configuration

Figure 3:
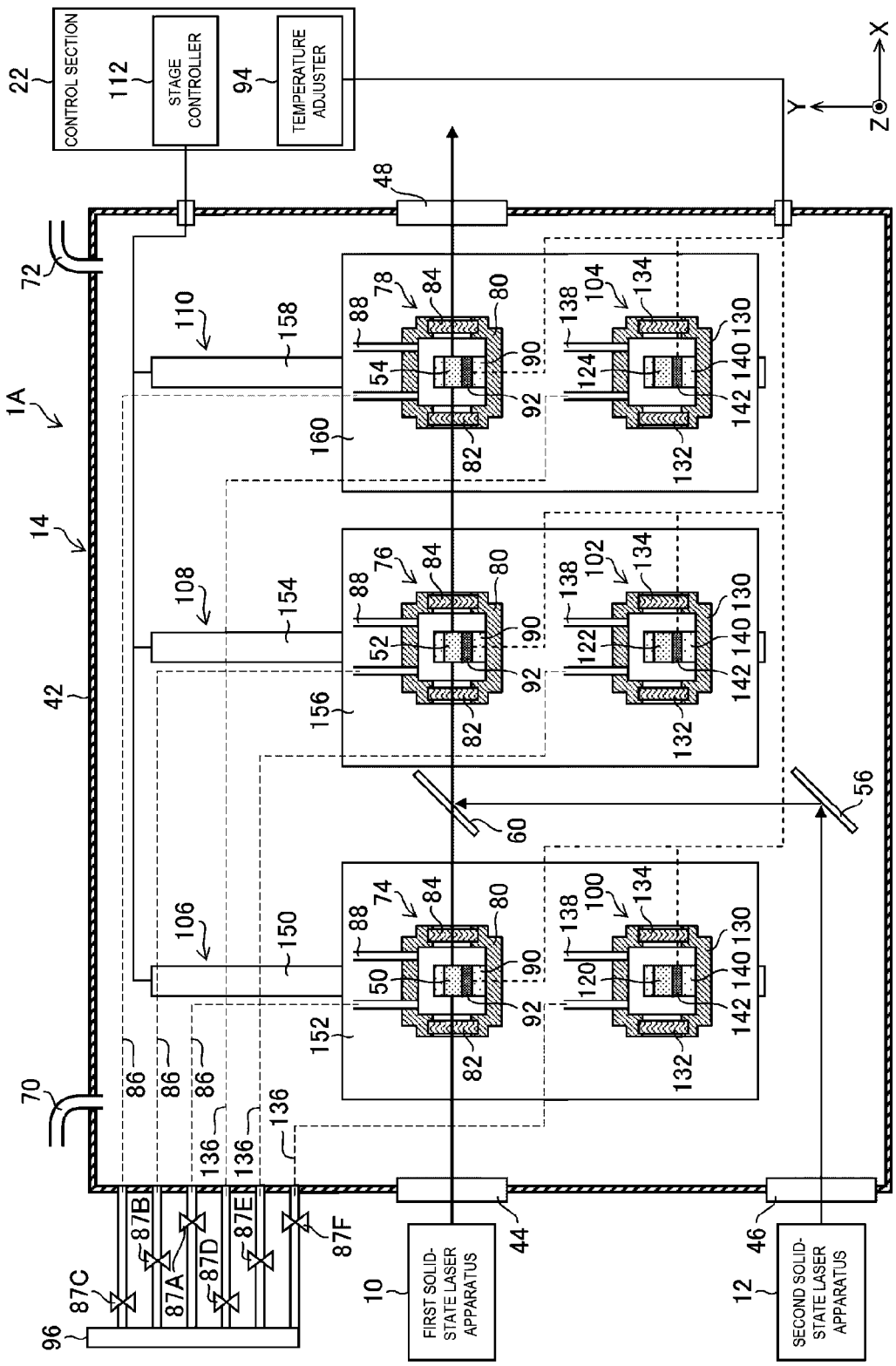
FIG. 3 schematically shows the configuration of a solid-state laser system according to a first embodiment.

FIG. 3 schematically shows the configuration of a solid-state laser system 1A according to a first embodiment. In FIG. 3, the directions in the description are defined as follows: the direction X is the right direction; the direction Y is the upper direction orthogonal to the direction X; and the direction Z is the direction orthogonal to the directions X and Y, as in FIG. 2. Differences from the solid-state laser system 1 shown in FIGS. 1 and 2 will be described below.

The solid-state laser system 1A shown in FIG. 3 includes a fourth CLBO crystal cell 100, a fifth CLBO crystal cell 102, and a sixth CLBO crystal cell 104.

The solid-state laser system 1A further includes a first stage 106, a second stage 108, and a third stage 110.

The solid-state laser system 1A still further includes a stage controller 112 in the control section 22.

The fourth CLBO crystal cell 100, the fifth CLBO crystal cell 102, and the sixth CLBO crystal cell 104 include a fourth CLBO crystal 120, a fifth CLBO crystal 122, and a sixth CLBO crystal 124, respectively. The fourth CLBO crystal 120 is a crystal that generates light having the same wavelength as the light generated by the first CLBO crystal 50. The fourth CLBO crystal 120 is an example of the "second nonlinear crystal" in the present disclosure. The fifth CLBO crystal 122 is a crystal that generates light having the same wavelength as the light generated by the second CLBO crystal 52. The sixth CLBO crystal 124 is a crystal that generates light having the same wavelength as the light generated by the third CLBO crystal 54.

The fourth CLBO crystal cell 100 includes a second container 130, a second light incident window 132, a second light exit window 134, a third purge gas inlet tube 136, a third purge gas outlet tube 138, a second crystal holder 140, and a second heater 142. The configurations of the second container 130, the second light incident window 132, the second light exit window 134, the third purge gas inlet tube 136, the third purge gas outlet tube 138, the second crystal holder 140, and the second heater 142 are the same as those of the first container 80, the first light incident window 82, the first light exit window 84, the second purge gas inlet tube 86, the second purge gas outlet tube 88, the first crystal holder 90, and the first heater 92, respectively. The third purge gas inlet tube 136 is an example of the "second gas introduction tube" in the present disclosure. The third purge gas outlet tube 138 is an example of the "second gas discharge tube" in the present disclosure.

The fourth CLBO crystal cell 100, the fifth CLBO crystal cell 102, and the sixth CLBO crystal cell 104 have the same configuration. The second crystal holders 140 of the fourth CLBO crystal cell 100, the fifth CLBO crystal cell 102, and the sixth CLBO crystal cell 104 hold the fourth CLBO crystal 120, the fifth CLBO crystal 122, and the sixth CLBO crystal 124, respectively.

The second purge gas inlet tubes 86 in the first CLBO crystal cell 74, the second CLBO crystal cell 76, and the third CLBO crystal cell 78 are connected to a common tube 96 via valves 87A, 87B, and 87C, respectively, outside the wavelength conversion box 42.

Similarly, the third purge gas inlet tubes 136 in the fourth CLBO crystal cell 100, the fifth CLBO crystal cell 102, and the sixth CLBO crystal cell 104 are connected to the common tube 96 via valves 87D, 87E, and 87F, respectively, outside the wavelength conversion box 42.

The valves 87A, 87B, and 87C are controlled by the control section 22 and switch between communication and blockage of the second purge gas inlet tubes 86. The valves 87A, 87B, and 87C may instead be configured to allow the second purge gas inlet tubes 86 to communicate with either the common tube 96 or a tube that is not shown. The tube that is not shown may communicate with a compressor that supplies the atmosphere.

Similarly, the valves 87D, 87E, and 87F are controlled by the control section 22 and switch between communication and blockage of the third purge gas inlet tubes 136. The valves 87D, 87E, and 87F may be configured to allow the third purge gas inlet tubes 136 to communicate with either the common tube 96 or a tube that is not shown. The tube that is not shown may communicate with a compressor that supplies the atmosphere.

The second purge gas inlet tubes 86 and the third purge gas inlet tubes 136 are each at least partially flexible.

The second heaters 142 in the fourth CLBO crystal cell 100, the fifth CLBO crystal cell 102, and the sixth CLBO crystal cell 104 are connected to the temperature adjuster 94.

The first stage 106 includes a rail 150 extending in the direction Y and a movable section 152 held by the rail 150 so as to be movable in the direction Y along the rail 150. The first CLBO crystal cell 74 and the fourth CLBO crystal cell 100 are arranged in the direction Y and held by the movable section 152.

The second stage 108 includes a rail 154 extending in the direction Y and a movable section 156 held by the rail 154 so as to be movable in the direction Y along the rail 154. The second CLBO crystal cell 76 and the fifth CLBO crystal cell 102 are arranged in the direction Y and held by the movable section 156.

Similarly, the third stage 110 includes a rail 158 extending in the direction Y and a movable section 160 held by the rail 158 so as to be movable in the direction Y along the rail 158. The third CLBO crystal cell 78 and the sixth CLBO crystal cell 104 are arranged in the direction Y and held by the movable section 160.

The first stage 106, the second stage 108, and the third stage 110 each include an actuator that is not shown. The actuators, which are not shown, are connected to the stage controller 112.

In the example shown in FIG. 3, the first CLBO crystal 50, the second CLBO crystal 52, and the third CLBO crystal 54 are placed in the optical path of the laser light, and the fourth CLBO crystal 120, the fifth CLBO crystal 122, and the sixth CLBO crystal 124 are placed outside the optical path of the laser light.

Figure 4:
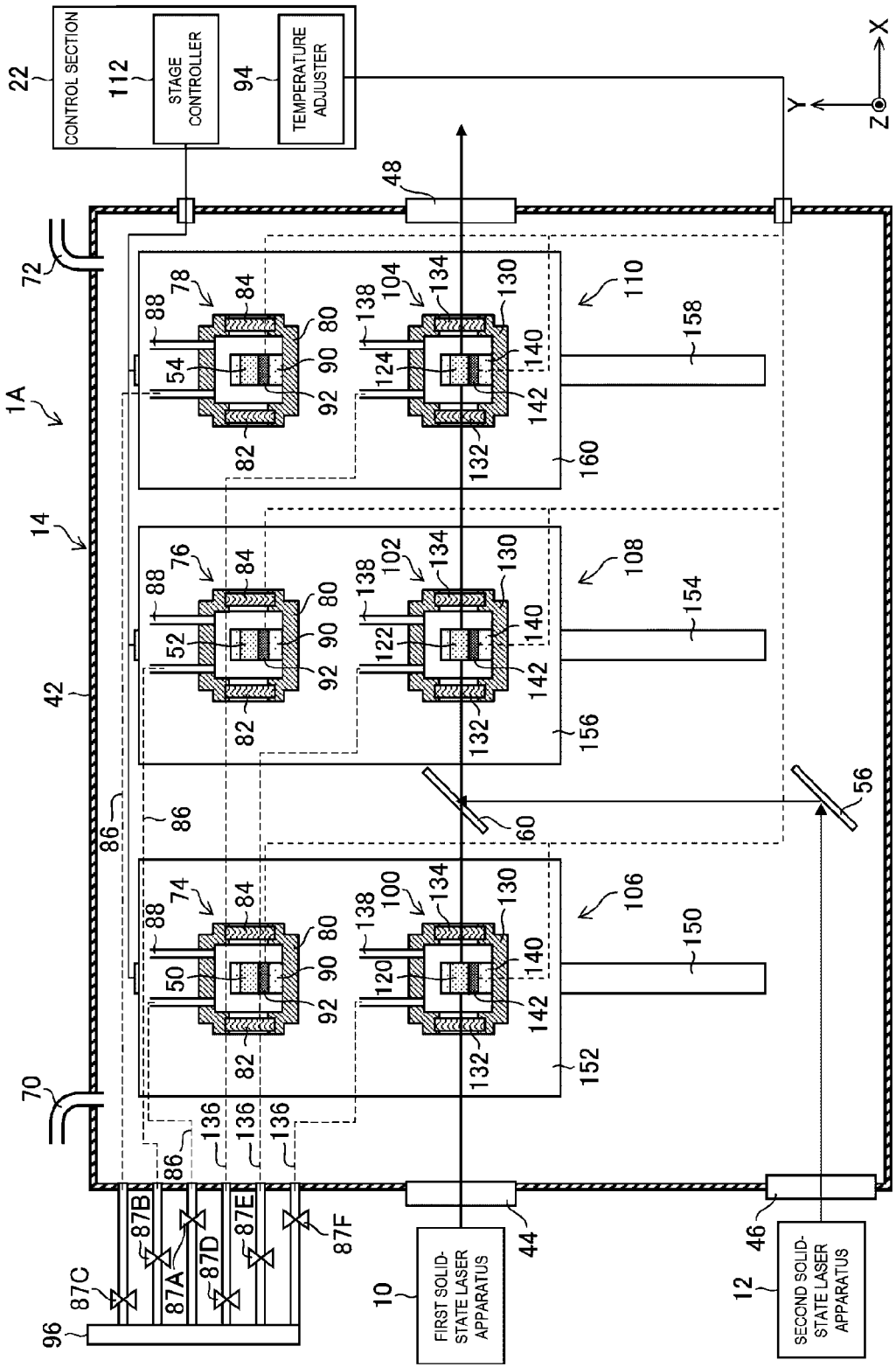
FIG. 4 shows the state in which a movable section has been moved from the state shown in FIG. 3.

FIG. 4 shows the state in which the movable sections 152, 156, and 160 have been moved from the state shown in FIG. 3. In the example shown in FIG. 4, the first CLBO crystal 50, the second CLBO crystal 52, and the third CLBO crystal 54 are placed outside the optical path of the laser light, and the fourth CLBO crystal 120, the fifth CLBO crystal 122, and the sixth CLBO crystal 124 are placed in the optical path of the laser light.

4.2 Operation

An operator causes in advance the first crystal holders 90 in the first CLBO crystal cell 74, the second CLBO crystal cell 76, and the third CLBO crystal cell 78 to hold the first CLBO crystal 50, the second CLBO crystal 52, and the third CLBO crystal 54, respectively, and stores the resultant units in the respective first containers 80. Similarly, the operator causes the second crystal holders 140 in the fourth CLBO crystal cell 100, the fifth CLBO crystal cell 102, and the sixth CLBO crystal cell 104 to hold the fourth CLBO crystal 120, the fifth CLBO crystal 122, and the sixth CLBO crystal 124, respectively, and stores the resultant units in the respective second containers 130.

The temperature adjuster 94 controls the first heaters 92 in the first CLBO crystal cell 74, the second CLBO crystal cell 76, and the third CLBO crystal cell 78 to heat the first CLBO crystal 50, the second CLBO crystal 52, and the third CLBO crystal 54 to 150° C. in a default step. Similarly, the temperature adjuster 94 controls the second heaters 142 in the fourth CLBO crystal cell 100, the fifth CLBO crystal cell 102, and the sixth CLBO crystal cell 104 to heat the fourth CLBO crystal 120, the fifth CLBO crystal 122, and the sixth CLBO crystal 124 to 150° C. in the default step.

The control section 22 purges the interior of the wavelength conversion box 42 with the $N_2$ gas for a default period at a default flow rate by introducing the $N_2$ gas via the first purge gas inlet tube 70 and discharging the $N_2$ gas via the first purge gas outlet tube 72.

Furthermore, the control section 22 purges the interiors of the first containers 80 in the first CLBO crystal cell 74, the second CLBO crystal cell 76, and the third CLBO crystal cell 78 with the Ar gas for a default period at a default flow rate. Similarly, the control section 22 purges the interiors of the second containers 130 in the fourth CLBO crystal cell 100, the fifth CLBO crystal cell 102, and the sixth CLBO crystal cell 104 with the Ar gas for a default period at a default flow rate.

The stage controller 112 places the first CLBO crystal cell 74, the second CLBO crystal cell 76, and the third CLBO crystal cell 78 in the optical path of the laser light, as in the example shown in FIG. 2. The control section 22 uses the first CLBO crystal cell 74, the second CLBO crystal cell 76, and the third CLBO crystal cell 78 to generate ultraviolet light.

Also while using the first CLBO crystal cell 74, the second CLBO crystal cell 76, and the third CLBO crystal cell 78 to generate the ultraviolet light, the control section 22 keeps maintaining the temperatures of the second heaters 142 and the gas flow rates in the second containers 130 in the fourth CLBO crystal cell 100, the fifth CLBO crystal cell 102, and the sixth CLBO crystal cell 104.

When the first CLBO crystal 50 reaches the end of its life, the stage controller 112 controls the first stage 106 to move the movable section 152 so that the first CLBO crystal 50 in the first CLBO crystal cell 74 is moved away from the optical path of the laser light and the fourth CLBO crystal 120 in the fourth CLBO crystal cell 100 is inserted into the optical path of the laser light. The wavelength conversion system 14 thus uses the fourth CLBO crystal 120 in place of the first CLBO crystal 50 to perform the wavelength conversion.

When the second CLBO crystal 52 reaches the end of its life, the stage controller 112 controls the second stage 108 to move the movable section 156 so that the second CLBO crystal 52 in the second CLBO crystal cell 76 moves away from the optical path of the laser light and the fifth CLBO crystal 122 in the fifth CLBO crystal cell 102 is inserted into the optical path of the laser light. The wavelength conversion system 14 thus uses the fifth CLBO crystal 122 in place of the second CLBO crystal 52 to perform the wavelength conversion.

When the third CLBO crystal 54 reaches the end of its life, the stage controller 112 controls the third stage 110 to move the movable section 160 so that the third CLBO crystal 54 in the third CLBO crystal cell 78 moves away from the optical path of the laser light and the sixth CLBO crystal 124 in the sixth CLBO crystal cell 104 is inserted into the optical path of the laser light. The wavelength conversion system 14 thus uses the sixth CLBO crystal 124 in place of the third CLBO crystal 54 to perform the wavelength conversion.

4.2.1 Crystal Replacement Control

Figure 5:
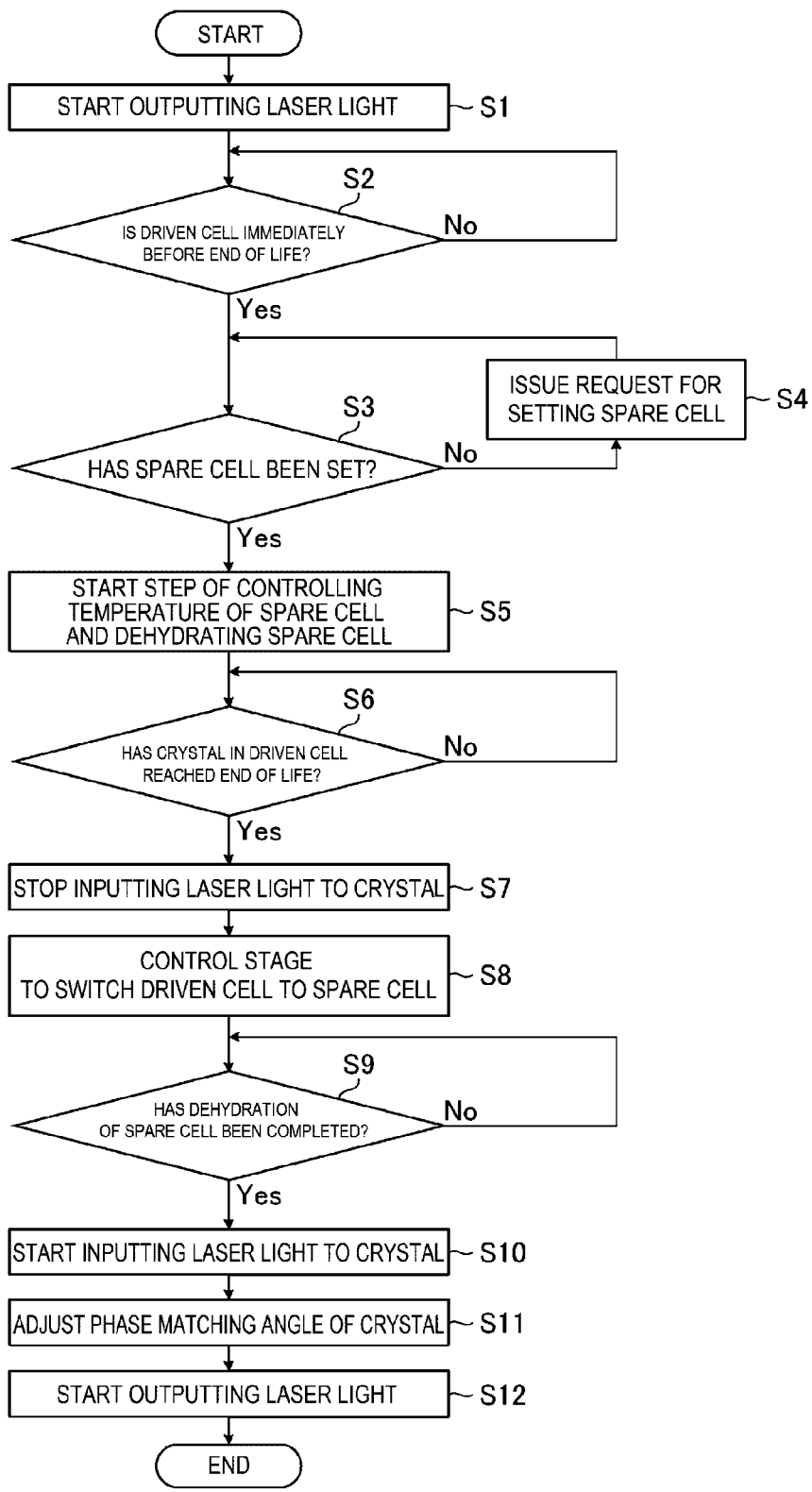
FIG. 5 is a flowchart showing an example of a method for controlling the solid-state laser system.

Crystal replacement control will be described in detail. FIG. 5 is a flowchart showing an example of how the control section 22 controls the solid-state laser system 1A during the crystal replacement. The description will be made of a case of replacement of the second CLBO crystal 52 with the fifth CLBO crystal 122.

In step S1, the control section 22 causes the solid-state laser system 1A to start outputting the pulsed laser light having the wavelength of about 193 nm. In the description, the stage controller 112 controls the first stage 106, the second stage 108, and the third stage 110 to place the first CLBO crystal cell 74, the second CLBO crystal cell 76, and the third CLBO crystal cell 78 in the optical path of the laser light. The fourth CLBO crystal cell 100, the fifth CLBO crystal cell 102, and the sixth CLBO crystal cell 104 are thus placed outside the optical path of the laser light.

The first CLBO crystal 50, the second CLBO crystal 52, and the third CLBO crystal 54 are therefore placed in the optical path of the laser light, and the fourth CLBO crystal 120, the fifth CLBO crystal 122, and the sixth CLBO crystal 124 are placed outside the optical path of the laser light. The solid-state laser system 1A uses the first CLBO crystal 50, the second CLBO crystal 52, and the third CLBO crystal 54 placed in the optical path of the laser light to perform the wavelength conversion and outputs the pulsed laser light having the wavelength of about 193 nm.

The first CLBO crystal cell 74, the second CLBO crystal cell 76, and the third CLBO crystal cell 78 placed in the optical path of the laser light are called driven cells. The fourth CLBO crystal cell 100, the fifth CLBO crystal cell 102, and the sixth CLBO crystal cell 104 placed outside the optical path of the laser light are called spare cells. When any of the driven cells used to perform the wavelength conversion reaches the end of its life, the solid-state laser system 1A switches the driven cell to the corresponding spare cell to perform the wavelength conversion.

In step S2, the control section 22 evaluates whether or not the first CLBO crystal 50 in the driven cell held by the movable section 152 of the first stage 106 is immediately before the end of its life. The control section 22 further evaluates whether or not the second CLBO crystal 52 in the driven cell held by the movable section 156 of the second stage 108 is immediately before the end of its life. Similarly, the control section 22 evaluates whether or not the third CLBO crystal 54 in the driven cell held by the movable section 160 of the third stage 110 is immediately before the end of its life.

When none of the first CLBO crystal 50, the second CLBO crystal 52, and the third CLBO crystal 54 is immediately before the end of its life, the control section 22 repeats the process in step S2. It is assumed that the control section 22 has determined that the second CLBO crystal 52 is immediately before the end of its life.

In step S3, the control section 22 evaluates whether or not the fifth CLBO crystal 122 has already been set in (held by) the second crystal holder 140 in the fifth CLBO crystal cell 102, which is a spare cell, held by the movable section 156 of the second stage 108. When the fifth CLBO crystal 122 has not been set in the second crystal holder 140, the control section 22 carries out the process in step S4. When the fifth CLBO crystal 122 has been set in the second crystal holder 140, the control section 22 carries out the process in step S5.

In step S4, the control section 22 displays on a display section, which is not shown, that the second CLBO crystal 52 in the driven cell is just immediately before the end of its life. The operator is thus requests to set the fifth CLBO crystal 122, which is a spare cell. The control section 22 then carries out the process in step S3.

In step S5, the control section 22 starts the step of controlling the temperature of the fifth CLBO crystal cell 102, which is a spare cell, and dehydrating the fifth CLBO crystal cell 102. The temperature control and dehydration step is an example of the "dehydration process" in the present disclosure.

To control the temperature of the spare cell, the temperature adjuster 94 carries out a heating process of heating the fifth CLBO crystal 122. That is, the temperature adjuster 94 controls the second heater 142 in the fifth CLBO crystal cell 102 to raise the temperature of the fifth CLBO crystal 122 to 150° C. at a rate of 1° C./min. The temperature adjuster 94 then maintains the temperature of the fifth CLBO crystal 122 at 150° C. until the fifth CLBO crystal 122 reaches the end of its life.

As the step of dehydrating the spare cell, the control section 22 carries out an atmosphere flow process. That is, the control section 22 keeps the air flowing into the second container 130 in the fifth CLBO crystal cell 102 via the third purge gas inlet tube 136 and the third purge gas outlet tube 138 for 48 hours to sufficiently dehydrate the fifth CLBO crystal cell 102.

The control section 22 then performs an inert gas flow process as the step of dehydrating the spare cell. That is, the control section 22 keeps an inert gas (Ar or Ne, for example) having a low dew point flowing in the second container 130 in the fifth CLBO crystal cell 102 for 48 hours to further dry the fifth CLBO crystal cell 102. An Ar gas is herein used as the inert gas. The dehydration step using the air may be omitted, and the fifth CLBO crystal cell 102 may be dried only by the dehydration step using an inert gas.

When the fifth CLBO crystal 122 has been set in advance in the spare cell, the temperature control and dehydration process may be initiated before the timing immediately before the second CLBO crystal 52 in the driven cell reaches the end of its life.

In step S6, the control section 22 evaluates whether or not the second CLBO crystal 52 in the driven cell has reached the end of its life. When the second CLBO crystal 52 has not reached the end of its life, the control section 22 repeats the process in step S6. When the second CLBO crystal 52 has reached the end of its life, the control section 22 carries out the process in step S7.

In step S7, the control section 22 stops inputting the laser light into the wavelength conversion system 14. For example, the control section 22 stops the operation of the first solid-state laser apparatus 10 and the second solid-state laser apparatus 12. The control section 22 may stop inputting the laser light into the wavelength conversion system 14 by closing a shutter that is not shown.

In step S8, the stage controller 112 controls the actuator, which is not shown, of the second stage 108 to move the second CLBO crystal 52 in the driven cell away from the optical path of the laser light and insert the fifth CLBO crystal 122 in the spare cell into the optical path of the laser light.

In step S9, the control section 22 evaluates whether or not the step of dehydrating the spare cell has been completed. When the 48-hour atmosphere flow process and the 48-hour inert gas flow process started in step S5 have been completed, the control section 22 carries out the process in step S10. When the 48-hour atmosphere flow process and the 48-hour inert gas flow process started in step S5 have not been completed, the control section 22 repeats the process in step S9.

In step S10, the control section 22 starts inputting the laser light to the wavelength conversion system 14. That is, the control section 22 causes the first solid-state laser apparatus 10 and the second solid-state laser apparatus 12 to start operating. In the description, the control section 22 controls a shutter that is not shown to block the laser light outputted from the solid-state laser system 1A.

In step S11, the control section 22 adjusts the phase matching angle of the fifth CLBO crystal 122 in the fifth CLBO crystal cell 102 that is a new driven cell. Although not shown in FIG. 3, the fifth CLBO crystal cell 102 includes an HVθ stage.

The control section 22 controls the HVθ stage in the fifth CLBO crystal cell 102 based on the result of detection performed by an energy sensor that is not shown but measures the energy of the laser light that exits via the third window 48. The control section 22 adjusts the phase matching angle of the fifth CLBO crystal 122 in such a way that the energy after the wavelength conversion is maximized.

Finally, in step S12, the control section 22 controls the shutter, which is not shown, to cause the solid-state laser system 1A to start outputting the pulsed laser light having the wavelength of about 193 nm.

4.2.2 Determination of Spare Cell Preparation Start Timing

The control section 22 determines the spare cell preparation start timing based on parameters of the laser light. The control section 22 detects the timing immediately before the end of the life of a driven cell based on at least one of the following (1) to (6) and starts the spare cell preparation (setting, temperature control, and dehydration step).

(1) Detection Based on Laser Radiation Period

The total laser radiation period for which the laser light is radiated onto a CLBO crystal is measured from the start of use of the driven cell, and the timing when a specified period elapses is detected based on the result of the measurement. For example, the total laser radiation period for which the laser light is radiated onto a CLBO crystal is 4000 hours at the longest, and the specified period is 3200 hours, which is 80% of 4000 hours.

(2) Detection Based on the Number of Pulses

The number of pulses by which the laser light is radiated onto a CLBO crystal is counted from the start of use of the driven cell, and the timing when a specified number of times is reached is detected based on the result of the counting. For example, the total number of pulses by which the laser light is radiated onto a CLBO crystal is 20 billions ($20 \times 10^9$) at the maximum, and the specified number of pulses is 16 billions, which is 80% of 20 billions.

(3) Detection Based on Intensity of Laser Light after Wavelength Conversion

A first energy sensor that is not shown is provided downstream from the wavelength conversion box 42 to detect the timing when the pulse energy of the wavelength converted light is smaller than or equal to a threshold. The threshold is, for example, 80 nW.

(4) Detection Based on Conversion Efficiency During Wavelength Conversion

The first energy sensor, which is not shown, is provided downstream from the wavelength conversion box 42, and a second energy sensor that is not shown is provided upstream therefrom. Let Eout be the output of the first energy sensor and Ein be the output of the second energy sensor, and the timing when conversion efficiency Eout/Ein during the wavelength conversion is smaller than or equal to a threshold is detected. For example, the threshold is 1% on the assumption that Eout is the output from the third CLBO crystal 54 and Ein is the input to the first CLBO crystal 50.

(5) Detection Based on the Number of Times of Movement of Light Incident Point

The CLBO crystals are partially contaminated at the light incident point on the laser light incident surface. Therefore, when the contamination has progressed to some extent, the crystals are each moved by a 2-axis stage so that the light incident point moves.

FIG. 6 shows the laser light incident surface of the second CLBO crystal 52. In FIG. 6, the laser light traveling direction is the direction Z, one direction perpendicular to the direction Z is the direction V, and the direction perpendicular to the directions V and Z is the direction H, as in FIG. 1. First, the second CLBO crystal 52 is used with the laser light incident on a point $P_1$. Thereafter, as the contamination at the point $P_1$ progresses, the second CLBO crystal 52 is moved in the direction H by the first HVθ stage 66 and used with the laser light incident on a point $P_2$. Whenever the contamination at the light incident point progresses, the second CLBO crystal 52 is moved in the direction H or V to switch the light incident point to points $P_3$, $P_4$, . . . , $P_{N-1}$, and $P_N$.

The timing when the number of times the light incident point is moved reaches a specified number of times is detected. Let N be the total number of light incident points, and the total movement number is (N−1), and the specified number of times is, for example, (N−2).

The movement of the light incident point on the second CLBO crystal 52 has been described, and the same applies to the first CLBO crystal 50, the third CLBO crystal 54, the fourth CLBO crystal 120, the fifth CLBO crystal 122, and the sixth CLBO crystal 124.

For example, a two-axis (ZY-plane) stage that is not shown can be further provided between the movable section 152 and the first CLBO crystal cell 74 or between the movable section 152 and the rail 150 to move the light incident point on the first CLBO crystal 50. In this case, let N be the total number of light incident points moved by the 2-axis stage, which is not shown, and the specified number of times may, for example, be (N−2).

(6) Detection Based on Intensity of Laser Light Before Wavelength Conversion

The first energy sensor, which is not shown, is provided downstream from the wavelength conversion box 42, and the second energy sensor, which is not shown, is provided upstream therefrom. When the energy before the wavelength conversion is so controlled that the energy after the wavelength conversion remains constant, the energy before the wavelength conversion increases as the CLBO crystal deteriorates. Therefore, the timing when the energy before the wavelength conversion is greater than or equal to a threshold is detected. The threshold is, for example, 8 W for the energy of the pulsed laser light having the wavelength of about 515 nm inputted to the wavelength conversion box 42.

4.3 Effects and Advantages

As described above, the solid-state laser system 1A allows the replacement of each of the crystals on a cell basis to be completed by simply moving the movable section of the stage, whereby the replacement period can be shortened.

Furthermore, when the movable section of the stage is moved, the crystal preparation, such as dehydration, has already started, whereby the replacement period can be further shortened.

Moreover, a crystal newly inserted into the optical path by the stage can be placed in roughly the same position in the optical path from which the crystal having been moved away, whereby the period for the adjustment of the phase matching angle can be shortened.

5. Second Embodiment

5.1 Configuration

Figure 7:
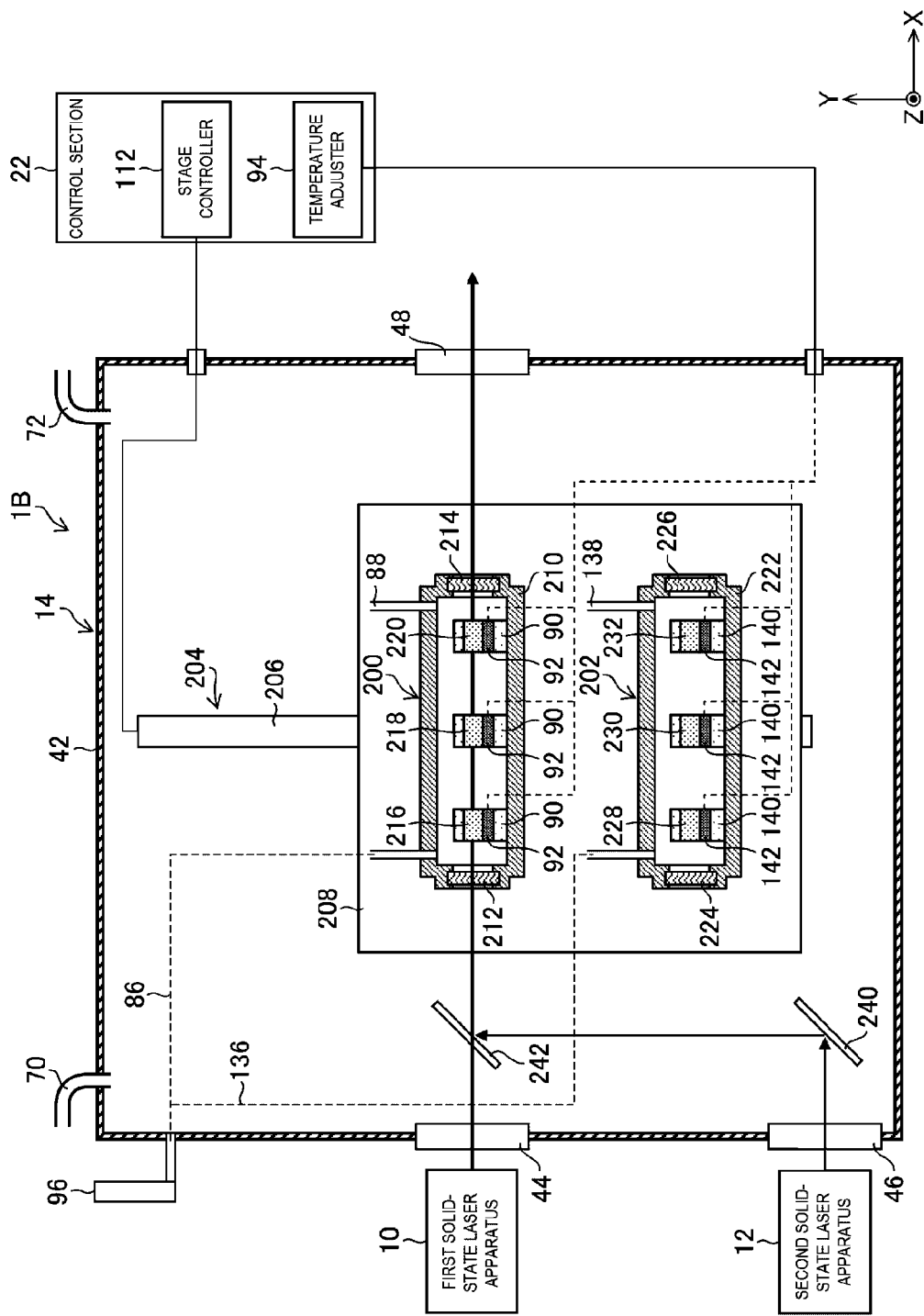
FIG. 7 schematically shows the configuration of a solid-state laser system according to a second embodiment.

FIG. 7 schematically shows the configuration of a solid-state laser system 1B according to a second embodiment. Differences from the solid-state laser system 1A shown in FIG. 3 will be described.

The solid-state laser system 1B shown in FIG. 7 includes a seventh CLBO crystal cell 200, an eighth CLBO crystal cell 202, a fourth stage 204, a third high-reflectance mirror 240, and a fourth dichroic mirror 242.

The fourth stage 204 includes a rail 206 extending in the direction Y and a movable section 208 held by the rail 206 so as to be movable in the direction Y along the rail 206. The seventh CLBO crystal cell 200 and the eighth CLBO crystal cell 202 are arranged in the direction Y and held by the movable section 208.

The fourth stage 204 includes an actuator that is not shown. The actuator, which is not shown, is connected to the stage controller 112.

The seventh CLBO crystal cell 200 includes a fourth container 210, a third light incident window 212, and a third light exit window 214. The fourth container 210 is an example of the "first container" in the present disclosure. The third light incident window 212 is an example of the "first light incident window" in the present disclosure. The third light exit window 214 is an example of the "first light exit window" in the present disclosure.

The fourth container 210 accommodates a plurality of CLBO crystals. The fourth container 210 accommodates three CLBO crystals arranged in series: a seventh CLBO crystal 216; an eighth CLBO crystal 218; and a ninth CLBO crystal 220. The seventh CLBO crystal 216 is an example of the "first nonlinear crystal" in the present disclosure.

Out of the seventh CLBO crystal 216, the eighth CLBO crystal 218, and the ninth CLBO crystal 220 arranged in series, the seventh CLBO crystal 216, which is the first one, and the ninth CLBO crystal 220, which is the third one, are each a wavelength converting crystal having a type-1 phase matching condition. On the other hand, the eighth CLBO crystal 218, which is the second one, is a wavelength converting crystal having a type-2 phase matching condition.

The seventh CLBO crystal 216, the eighth CLBO crystal 218, and the ninth CLBO crystal 220 are each held by the first crystal holder 90. The seventh CLBO crystal 216, the eighth CLBO crystal 218, and the ninth CLBO crystal 220 are each provided with the first heater 92. The third light incident window 212, the seventh CLBO crystal 216, the eighth CLBO crystal 218, the ninth CLBO crystal 220, and the third light exit window 214 are arranged in series in the direction X.

The eighth CLBO crystal cell 202 includes a fifth container 222, a fourth light incident window 224, and a fourth light exit window 226. The fifth container 222 is an example of the "second container" in the present disclosure. The fourth light incident window 224 is an example of the "second light incident window" in the present disclosure. The fourth light exit window 226 is an example of the "second light exit window" in the present disclosure.

The fifth container 222 accommodates a plurality of CLBO crystals. The fifth container 222 accommodates three CLBO crystals arranged in series: a tenth CLBO crystal 228; an eleventh CLBO crystal 230; and a twelfth CLBO crystal 232. The tenth CLBO crystal 228 is an example of the "second nonlinear crystal" in the present disclosure.

The tenth CLBO crystal 228 is a crystal that generates light having the same wavelength as the light generated by the seventh CLBO crystal 216. The eleventh CLBO crystal 230 is a crystal that generates light having the same wavelength as the light generated by the eighth CLBO crystal 218. The twelfth CLBO crystal 232 is a crystal that generates light having the same wavelength as the light generated by the ninth CLBO crystal 220.

The tenth CLBO crystal 228 and the twelfth CLBO crystal 232 are each a wavelength converting crystal having the type-1 phase matching condition. On the other hand, the eleventh CLBO crystal 230 is a wavelength converting crystal having the type-2 phase matching condition.

Instead, the seventh CLBO crystal 216 and the eighth CLBO crystal 218 may each be a wavelength converting crystal having the type-1 phase-matching condition, and the ninth CLBO crystal 220 may be a wavelength converting crystal having the type-2 phase-matching condition. In this case, the tenth CLBO crystal 228 and the eleventh CLBO crystal 230 are each a wavelength converting crystal having the type-1 phase-matching condition, and the twelfth CLBO crystal 232 is a wavelength converting crystal having the type-2 phase-matching condition.

The tenth CLBO crystal 228, the eleventh CLBO crystal 230, and the twelfth CLBO crystal 232 are each held by the second crystal holder 140. The second CLBO crystal holder 140 is an example of the "second crystal holder" in the present disclosure. The tenth CLBO crystal 228, the eleventh CLBO crystal 230, and the twelfth CLBO crystal 232 are each provided with the second heater 142. The fourth light incident window 224, the tenth CLBO crystal 228, the eleventh CLBO crystal 230, the twelfth CLBO crystal 232, and the fourth light exit window 226 are arranged in series in the direction X.

The third high-reflectance mirror 240 is so disposed as to reflect at high reflectance the second pulsed laser light outputted from the second solid-state laser apparatus 12 and incident via the second window 46 and cause the reflected light to be incident on the fourth dichroic mirror 242.

The fourth dichroic mirror 242 is coated with a film that transmits at high transmittance the pulsed laser light outputted from the first solid-state laser apparatus 10, incident via the first window 44, and having the wavelength of about 515 nm and reflects at high reflectance the second pulsed laser light having the wavelength of about 1553 nm. The fourth dichroic mirror 242 is so disposed that the pulsed laser light having the wavelength of about 515 nm and the second pulsed laser light are incident on the seventh CLBO crystal cell 200 or the eighth CLBO crystal cell 202 with the optical path axes of the two types of pulsed laser light aligned with each other.

A collimator lens that is not shown but parallelizes the pulsed laser light may be disposed in the optical path between the first window 44 and the fourth dichroic mirror 242. A beam expander (BEX) lens or a focusing lens either of which is not shown but adjusts the beam diameter of the pulsed laser light may be disposed in the optical path between the third high-reflectance mirror 240 and the fourth dichroic mirror 242. The BEX lens may be formed of a pair of concave and convex lenses that are not shown.

Figure 8:
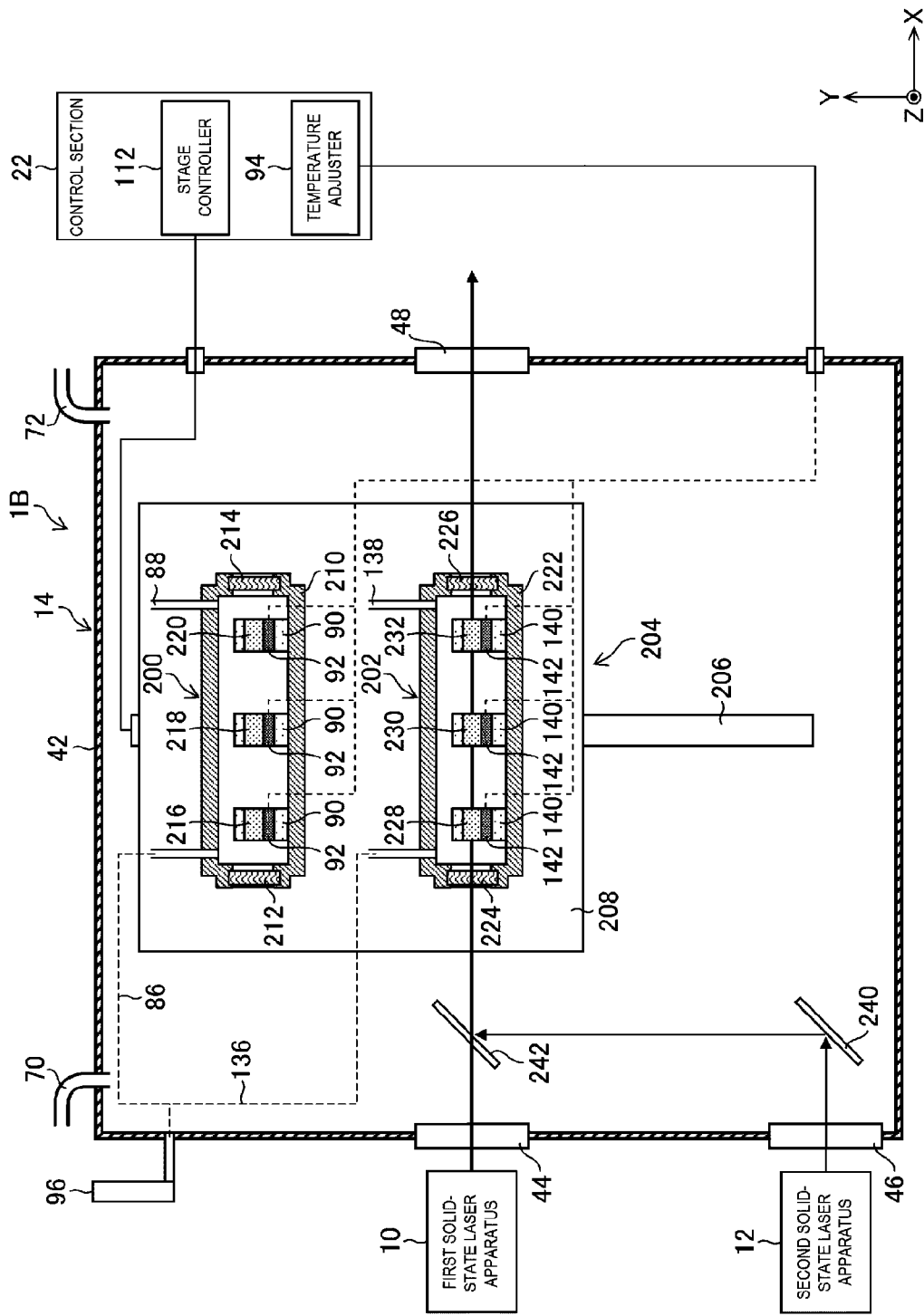
FIG. 8 shows the state in which a movable section has been moved from the state shown in FIG. 7.

In the example shown in FIG. 7, the seventh CLBO crystal cell 200 is placed in the optical path of the laser light, and the eighth CLBO crystal cell 202 is placed outside the optical path of the laser light. FIG. 8 shows the state in which the movable section 208 has been moved from the state shown in FIG. 7. In the example shown in FIG. 8, the seventh CLBO crystal cell 200 is placed outside the optical path of the laser light, and the eighth CLBO crystal cell 202 is placed in the optical path of the laser light.

5.2 Operation

The operator causes the first crystal holders 90 in the seventh CLBO crystal cell 200 to hold the seventh CLBO crystal 216, the eighth CLBO crystal 218, and the ninth CLBO crystal 220 and stores the resultant units in the fourth container 210 in advance. Similarly, the operator causes the second crystal holders 140 in the eighth CLBO crystal cell 202 to hold the tenth CLBO crystal 228, the eleventh CLBO crystal 230, and the twelfth CLBO crystal 232 and stores the resultant units in the fifth container 222.

The temperature adjuster 94 controls the first heaters 92 for the seventh CLBO crystal 216, the eighth CLBO crystal 218, and the ninth CLBO crystal 220 to heat the CLBO crystals to 150° C. in the default step. Similarly, the temperature adjuster 94 controls the second heaters 142 for the tenth CLBO crystal 228, the eleventh CLBO crystal 230, and the twelfth CLBO crystal 232 to heat the CLBO crystals to 150° C. in the default step.

The control section 22 subsequently purges the interior of the wavelength conversion box 42 with the $N_2$ gas for a default period at a default flow rate. The control section 22 further purges the interior of the fourth container 210 in the seventh CLBO crystal cell 200 and the interior of the fifth container 222 in the eighth CLBO crystal cell 202 with the Ar gas for a default period at a default flow rate.

The stage controller 112 places the seventh CLBO crystal 216, the eighth CLBO crystal 218, and the ninth CLBO crystal 220 in the optical path of the laser light, as shown in FIG. 7.

The control section 22 causes the solid-state laser system 1B to generate ultraviolet light in this state. That is, the control section 22 causes the pulsed laser light outputted by the first solid-state laser apparatus 10 and having the wavelength of about 515 nm to enter via the first window 44 and causes the second pulsed laser light outputted by the second solid-state laser apparatus 12 and having the wavelength of about 1553 nm to enter via the second window 46. The pulsed laser light having the wavelength of about 515 nm and the second pulsed laser light having the wavelength of about 1553 nm thus enter the seventh CLBO crystal 216 via the fourth dichroic mirror 242 roughly at the same time along roughly the same optical path axis.

The angle of incidence of the pulsed laser light having the wavelength of about 515 nm incident on the seventh CLBO crystal 216 is adjusted so as to satisfy the phase matching condition. As a result, the seventh CLBO crystal 216 generates the pulsed laser light having the wavelength of about 258 nm, which is the second harmonic of the pulsed laser light having the wavelength of about 515 nm. The pulsed laser light having the wavelength of about 258 nm and the pulsed laser light having the wavelength of about 1553 nm therefore exit from the seventh CLBO crystal 216.

The pulsed laser light having the wavelength of about 258 nm and the pulsed laser light having the wavelength of about 1553 nm enter the eighth CLBO crystal 218 roughly at the same time along roughly the same optical path axis.

The angle of incidence of the pulsed laser light having the wavelength of about 258 nm and the angle of incidence of the pulsed laser light having the wavelength of about 1553 nm incident on the eighth CLBO crystal 218 are adjusted so as to satisfy the phase alignment condition. As a result, the eighth CLBO crystal 218 generates the pulsed laser light having the wavelength of about 221 nm, which corresponds to the sum frequency produced from the wavelength of the pulsed laser light having the wavelength of about 258 nm and the wavelength of the pulsed laser light having the wavelength of about 1553 nm. The pulsed laser light having the wavelength of about 221 nm, the pulsed laser light having the wavelength of about 258 nm, and the pulsed laser light having the wavelength of about 1553 nm therefore exit from the eighth CLBO crystal 218.

The pulsed laser light having the wavelength of about 221 nm, the pulsed laser light having the wavelength of about 258 nm, and the pulsed laser light having the wavelength of about 1553 nm enter the ninth CLBO crystal 220.

The angle of incidence of the pulsed laser light having the wavelength of about 221 nm and the angle of incidence of the pulsed laser light having the wavelength of about 1553 nm incident on the ninth CLBO crystal 220 are adjusted so as to satisfy the phase alignment condition. As a result, the ninth CLBO crystal 220 generates the pulsed laser light having the wavelength of about 193 nm, which corresponds to the sum frequency produced from the wavelength of the pulsed laser light having the wavelength of about 221 nm and the wavelength of the pulsed laser light having the wavelength of about 1553 nm. The pulsed laser light having the wavelength of about 193 nm is outputted from the wavelength conversion system 14 via the third light exit window 214 and the third window 48.

As described above, also while causing the seventh CLBO crystal 216, the eighth CLBO crystal 218, and the ninth CLBO crystal 220 in the seventh CLBO crystal cell 200 to each generate the ultraviolet light, the control section 22 keeps maintaining the temperature of the second heaters 142 in the eighth CLBO crystal cell 202 and the gas flow rate in the fifth container 222.

When any of the seventh CLBO crystal 216, the eighth CLBO crystal 218, and the ninth CLBO crystal 220 reaches the end of its life, the stage controller 112 controls the fourth stage 204 to move the movable section 208 so that the seventh CLBO crystal 216, the eighth CLBO crystal 218, and the ninth CLBO crystal 220 in the seventh CLBO crystal cell 200 move away from the optical path of the laser light. Furthermore, the stage controller 112 inserts the tenth CLBO crystal cell 228, the eleventh CLBO crystal cell 230, and the twelfth CLBO crystal cell 232 in the eighth CLBO crystal cell 202 into the optical path of the laser light. The wavelength conversion system 14 thus performs the wavelength conversion by using the tenth CLBO crystal 228, the eleventh CLBO crystal 230, and the twelfth CLBO crystal 232 in place of the seventh CLBO crystal 216, the eighth CLBO crystal 218, and the ninth CLBO crystal 220.

5.3 Effects and Advantages

As described above, the solid-state laser system 1B provides the same effects and advantages as the first embodiment.

Furthermore, since the optical paths are coupled to each other before inputted to the CLBO crystals, a plurality of CLBO crystals (three in the description) can be arranged in series in each of the CLBO crystal cell for the wavelength conversion and the CLBO crystal cell for backup, whereby the size of the wavelength conversion system 14 can be reduced.

Moreover, since the plurality of CLBO crystals are disposed in a single CLBO crystal cell, the number of stages and tubes can be reduced, whereby the size of the entire apparatus can be reduced.

Furthermore, since the plurality of CLBO crystals can be replaced by replacing the single CLBO crystal cell, the period required for maintenance can be shortened.

6. Method for Manufacturing Electronic Device

Figure 9:
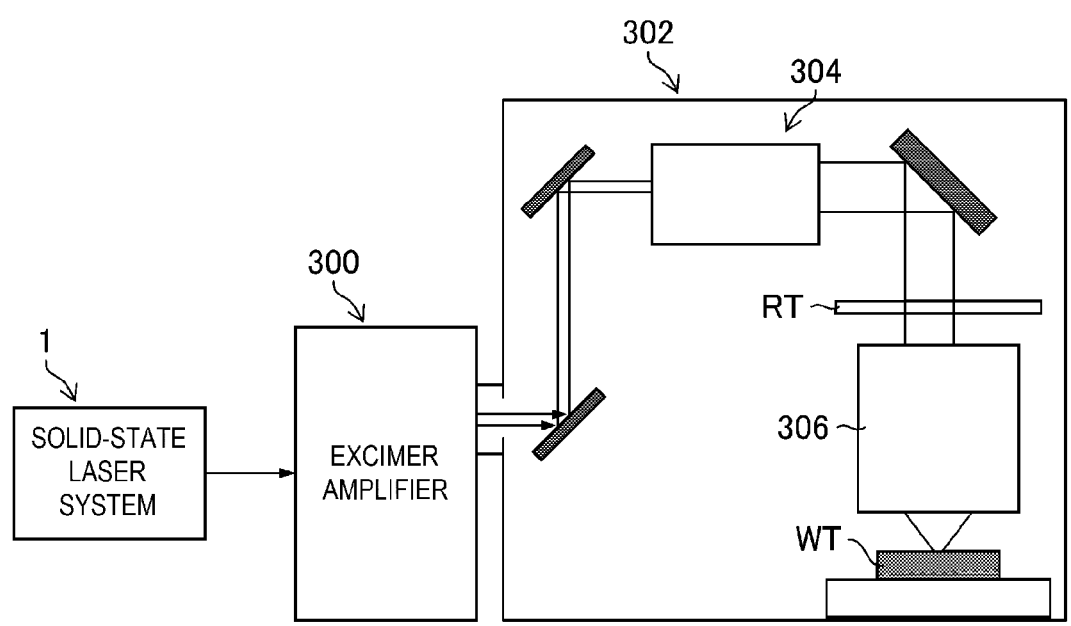
FIG. 9 schematically shows an example of the configuration of an exposure apparatus.

FIG. 9 schematically shows an example of the configuration of an exposure apparatus 302. The method for manufacturing electronic devices is achieved by the solid-state laser system 1, an excimer amplifier 300, and the exposure apparatus 302.

The excimer amplifier 300 is, for example, an ArF excimer laser apparatus that amplifies laser light. The solid-state laser system 1 and the excimer amplifier 300 form a hybrid laser apparatus. The excimer amplifier 300 amplifies the pulsed laser light outputted from the solid-state laser system 1. The pulsed laser light amplified by the excimer amplifier 300 is inputted to the exposure apparatus 302 and used as exposure light.

The exposure apparatus 302 includes an illumination optical system 304 and a projection optical system 306. The illumination optical system 304 illuminates a reticle pattern on a reticle stage RT with the excimer laser light having entered the exposure apparatus 302 from the excimer amplifier 300. The projection optical system 306 performs reduction projection of the laser light having passed through the reticle to bring the laser light into focus on a workpiece that is not shown but is placed on a workpiece table WT. The workpiece is a light sensitive substrate onto which a photoresist has been applied, such as a semiconductor wafer. The exposure apparatus 302 translates the reticle stage RT and the workpiece table WT in synchronization with each other to expose the workpiece to the laser light having reflected the reticle pattern. Semiconductor devices can be manufactured by transferring a device pattern onto the semiconductor wafer in the exposure step described above. The semiconductor devices are an example of the "electronic devices" in the present disclosure. The solid-state laser system 1 may be either of the solid-state laser systems 1A and 1B described in the embodiments.

7. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A laser system comprising:
a solid-state laser apparatus configured to output laser light;
a first crystal holder configured to hold a first nonlinear crystal placed in an optical path of the laser light;
a first heater configured to heat the first nonlinear crystal;
a first container configured to accommodate the first heater and the first crystal holder and including a first light incident window via which the laser light is incident and a first light exit window via which the laser light exits;
a first gas introduction tube via which a first gas is introduced into the first container;
a first gas discharge tube via which the first gas in the first container is discharged;
a second crystal holder configured to hold a second nonlinear crystal placed outside the optical path of the laser light;
a second heater configured to heat the second nonlinear crystal;
a second container configured to accommodate the second heater and the second crystal holder and including a second light incident window via which the laser light is incident and a second light exit window via which the laser light exits when the second container is placed in the optical path of the laser light;
a second gas introduction tube via which the first gas is introduced into the second container;
a second gas discharge tube via which the first gas in the second container is discharged;

a stage configured to hold the first and second containers; and a controller configured to control the stage to move the first nonlinear crystal away from the optical path of the laser light and insert the second nonlinear crystal into the optical path of the laser light, wherein the controller is configured to carry out a dehydration process of dehydrating the second nonlinear crystal when the first nonlinear crystal is placed in the optical path of the laser light.

2. The laser system according to claim 1,
wherein the controller is configured to carry out as the dehydration process
a heating process of heating the second nonlinear crystal, and
an inert gas flow process of introducing an inert gas into the second container while discharging the inert gas from the second container.

3. The laser system according to claim 2,
wherein the controller is configured to carry out, as the dehydration process, an atmosphere flow process of introducing the atmosphere into the second container while discharge the atmosphere from the second container before the inert gas flow process is carried out.

4. The laser system according to claim 3,
wherein the controller is configured to evaluate whether or not the second nonlinear crystal has been held in the second crystal holder before carrying out the dehydration process.

5. The laser system according to claim 1,
wherein the first and second containers each accommodate a plurality of nonlinear crystals arranged in series.

6. The laser system according to claim 5,
wherein the first and second containers each accommodate three nonlinear crystals arranged in series.

7. The laser system according to claim 6,
wherein the nonlinear crystals are each a CLBO ($CsLiB_6O_{10}$) crystal.

8. The laser system according to claim 7,
wherein out of the three CLBO crystals arranged in series, a first CLBO crystal and a third CLBO crystal is configured to perform type-1 phase matching and a second CLBO crystal is configured to perform type-2 phase matching.

9. The laser system according to claim 8,
wherein a movable section of the stage is configured to move in a direction orthogonal to a direction in which the nonlinear crystals are arranged in series.

10. The laser system according to claim 1, further comprising:
a third container configured to accommodate the first and second containers;
a third gas introduction tube via which a second gas is introduced into the third container; and
a third gas discharge tube via which the second gas in the third container is discharged.

11. The laser system according to claim 10,
wherein the first gas is an Ar gas, and the second gas is a $N_2$ gas.

12. The laser system according to claim 1,
wherein the controller is configured to determine, based on a parameter of the laser light, a timing when the dehydration process of dehydrating the second nonlinear crystal is started.

13. The laser system according to claim 12,
wherein the parameter is a radiation period for which the laser light is incident on the first nonlinear crystal.

14. The laser system according to claim 12,
wherein the parameter is the number of pulses of the laser light incident on the first nonlinear crystal.

15. The laser system according to claim 12,
wherein the parameter is energy of the laser light after the laser light incident on the first nonlinear crystal undergoes wavelength conversion.

16. The laser system according to claim 12,
wherein the parameter is conversion efficiency at which the laser light incident on the first nonlinear crystal is converted.

17. The laser system according to claim 12,
wherein the parameter is the number of times by which a light incident point where the laser light is incident on the first nonlinear crystal is moved.

18. The laser system according to claim 12,
wherein the parameter is energy of the laser light before the laser light incident on the first nonlinear crystal undergoes wavelength conversion.

19. A method for manufacturing electronic devices, the method comprising:
causing a laser system to generate excimer laser light, the laser system including
a solid-state laser apparatus configured to output laser light,
a first crystal holder configured to hold a first nonlinear crystal placed in an optical path of the laser light,
a first heater configured to heat the first nonlinear crystal,
a first container configured to accommodate the first heater and the first crystal holder and including a first light incident window via which the laser light is incident and a first light exit window via which the laser light exits,
a first gas introduction tube via which a first gas is introduced into the first container,
a first gas discharge tube via which the first gas in the first container is discharged,
a second crystal holder configured to hold a second nonlinear crystal placed outside the optical path of the laser light,
a second heater configured to heat the second nonlinear crystal,
a second container configured to accommodate the second heater and the second crystal holder and including a second light incident window via which the laser light is incident and a second light exit window via which the laser light exits when the second container is placed in the optical path of the laser light,
a second gas introduction tube via which the first gas is introduced into the second container,
a second gas discharge tube via which the first gas in the second container is discharged,
a stage configured to hold the first and second containers,
a controller configured to control the stage to move the first nonlinear crystal away from the optical path of the laser light and insert the second nonlinear crystal into the optical path of the laser light,
the controller is configured to carry out a dehydration process of dehydrating the second nonlinear crystal when the first nonlinear crystal is placed in the optical path of the laser light, and
an excimer amplifier configured to amplify the laser light that exits via the first or second light exit window,
outputting the excimer laser light to an exposure apparatus; and exposing a light sensitive substrate to the excimer laser light in the exposure apparatus to manufacture the electronic devices.

\* \* \* \* \*